(12) United States Patent
Gelorme et al.

(10) Patent No.: US 7,219,713 B2
(45) Date of Patent: May 22, 2007

(54) HETEROGENEOUS THERMAL INTERFACE FOR COOLING

(75) Inventors: Jeffrey D. Gelorme, Burlington, CT (US); Supratik Guha, Chappaqua, NY (US); Nancy C. LaBianca, Yalesville, CT (US); Yves Martin, Ossining, NY (US); Theodore G. Van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/037,913

(22) Filed: Jan. 18, 2005

(65) Prior Publication Data

US 2006/0157223 A1   Jul. 20, 2006

(51) Int. Cl.
*F28F 7/00* (2006.01)
(52) U.S. Cl. ...................... 165/80.4; 165/185
(58) Field of Classification Search ...... 165/80.3–80.5, 165/185
See application file for complete search history.

(56) References Cited

U.S. PATENT DOCUMENTS

| | | | | |
|---|---|---|---|---|
| 4,225,561 A | * | 9/1980 | Torres | 422/171 |
| 5,198,189 A | * | 3/1993 | Booth et al. | 420/555 |
| 5,365,402 A | * | 11/1994 | Hatada et al. | 165/80.4 |
| 6,037,658 A | * | 3/2000 | Brodsky et al. | 257/707 |
| 6,301,109 B1 | | 10/2001 | Chu et al. | |
| 6,665,186 B1 | * | 12/2003 | Calmidi et al. | 165/80.4 |
| 6,946,190 B2 | * | 9/2005 | Bunyan | 428/334 |
| 2003/0187116 A1 | * | 10/2003 | Misra et al. | 524/404 |
| 2005/0155752 A1 | * | 7/2005 | Larson et al. | 165/185 |

OTHER PUBLICATIONS

R.R. Schmidt, B.D. Notohardjono, "High-end Server Low-temperature Cooling", IBM Technical Disclosure Bulletin, Nov. 2002, pp. 739-751.

* cited by examiner

*Primary Examiner*—Teresa J. Walberg
(74) *Attorney, Agent, or Firm*—Patterson & Sheridan, LLP; Kin-Wah Tong, Esq.; Ido Tuchman, Esq.

(57) ABSTRACT

The present invention is a thermal interface for coupling a heat source to a heat sink. One embodiment of the invention comprises a mesh and a liquid, e.g., a thermally conductive liquid, disposed in the mesh. The mesh and the thermally conductive liquid are adapted to contact both the heat source and the heat sink when disposed therebetween. In one embodiment, the mesh may comprise a metal or organic material compatible with the liquid. In one embodiment, the liquid may comprise liquid metal. For example, the liquid may comprise a gallium indium tin alloy. A gasket may optionally be used to seal the mesh and the liquid between the heat source and the heat sink. In one embodiment, the heat source is an integrated circuit chip.

37 Claims, 1 Drawing Sheet

HETEROGENEOUS THERMAL INTERFACE FOR COOLING

BACKGROUND

The present invention relates generally to a thermal interface, and relates more particularly to the cooling of integrated circuit chips. Specifically, the present invention relates to a heterogeneous thermal interface for chip cooling.

Efficient cooling of integrated circuit (IC) devices is essential to prevent failure due to excessive heating. As the number of CMOS devices per chip and clock speeds have increased, such efficient cooling has become an even more prominent concern. Efficient cooling of the IC chips depends in large part on a good thermal interface between the chips and cooling blocks, or heat sinks, because a major part of the heat resistance budget is expended between the chip and the heat sink.

Conventionally, the thermal interface between a chip and a heat sink includes a thin layer of thermally conductive paste disposed between opposing surfaces of the chip and the heat sink unit. Typically, the layer of paste is approximately 100 microns thick and is mechanically compliant to conform to the sometimes irregular surfaces of the chip and heat sink.

Such conductive pastes have generally proven to be reliable in facilitating heat transfer. However, the thermal conductivity of conventional pastes is generally limited (e.g., typical pastes have a thermal conductivity of approximately 0.1 W/mK). Thus, limited chip cooling is achieved. Furthermore, heavy cycling may cause non-uniform behavior in a paste, or may cause a paste to fail to thermally bond the chip to the heat sink, resulting in thermal run-away and also limiting chip cooling. Moreover, the trend towards smaller, more powerful chips that generate even greater amounts of heat makes reliance on thermal pastes inadequate.

Thus, there is a need for a thermal interface that is capable of establishing reliable thermal contact, and of providing sufficient thermal conductivity and mechanical compliance between a chip and a heat sink.

SUMMARY OF THE INVENTION

The present invention is a thermal interface for coupling a heat source to a heat sink. One embodiment of the invention comprises a mesh and a thermally conductive liquid disposed in the mesh. The mesh and the thermally conductive liquid are adapted to contact both the heat source and the heat sink when disposed therebetween. In one embodiment, the mesh may comprise a metal or organic material compatible with the liquid. In one embodiment, the liquid may comprise liquid metal. For example, the liquid may comprise a gallium indium tin alloy. A gasket may optionally be used to seal the mesh and the liquid between the heat source and the heat sink. In one embodiment, the heat source is an integrated circuit chip.

In another aspect of the invention, a method for cooling a heat source with a heat sink is provided. In one embodiment, the method includes providing a thermal interface having a mesh and a liquid disposed in the mesh. The thermal interface is interposed between the heat source and the heat sink, such that the mesh and the liquid are in contact with the heat source on a first side of the thermal interface and in contact with the heat sink on a second side of the thermal interface.

In another aspect of the invention, a method of fabricating a thermal interface for assisting the thermal transfer of heat from a heat source to a heat sink is provided. In one embodiment, the method includes providing a mesh. A liquid is disposed in the mesh in sufficient quantity to substantially fill the mesh. The liquid comprises liquid metal. Optionally, the liquid metal may subsequently be frozen in place.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1:
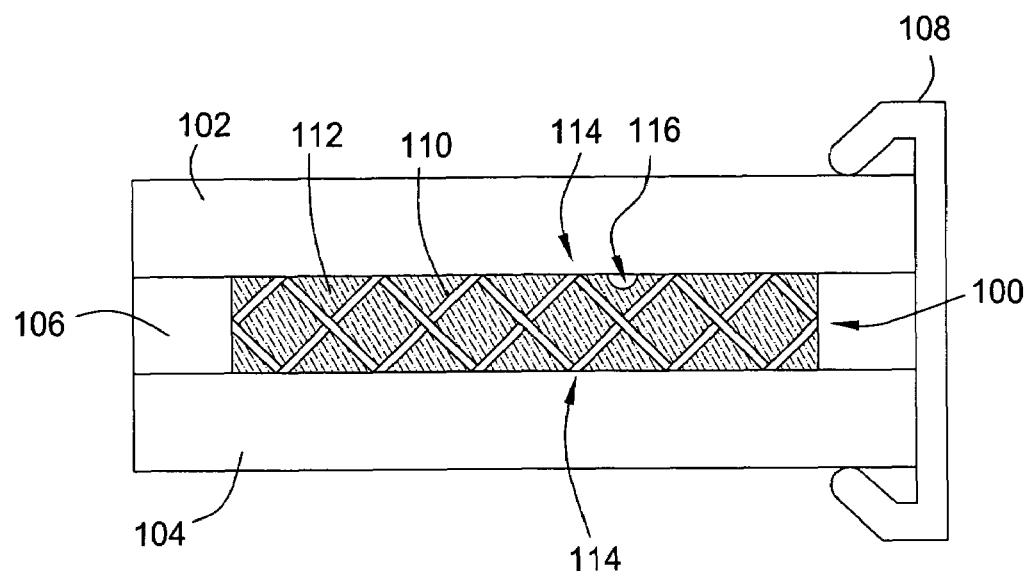
FIG. 1 illustrates a cross sectional view of one embodiment of a thermal interface according to the present invention.

FIG. 1 depicts a cross-sectional view of one embodiment of a thermal interface 100. The thermal interface 100 is disposed between a heat source 102 and a heat sink 104. The heat source 102 may be any heat source, including but not limited to an integrated circuit (IC) chip. The heat sink 104 may be any heat sink, such as a cold plate of air-cooled fins, water-cooled fins, heat pipes, radiators, thermal spreaders, and the like. The thermal interface 100, heat source 102 and heat sink 104 may be held together in an assembly by any suitable means, such as bonding, adhering, clamping, brackets, fixtures, and the like. In the embodiment depicted in FIG. 1, the heat source 102, the heat sink 104, and the thermal interface 100 are held together by at least one clamp 108.

The thermal interface 100 is typically formed in the range of from about 50 to about 200 microns thick and generally includes a thermally conductive, heat transfer liquid 112 disposed in a mesh 110. The liquid 112 is held within the mesh 110 by surface tension, which is maximized by the relatively large surface area of the structure of the mesh 110. The mesh 112 aids in the retention, control, and application of the liquid 112 during fabrication. In addition, the adherence of the liquid 112 to the mesh 110 advantageously prevents or minimizes jetting of the liquid 112 from the thermal interface 100 during shock events (i.e., the expulsion force generated when the heat source 102 and heat sink 104 suddenly move towards one another, for example, when the assembly is dropped or jarred, generally does not exceed the retention force of the surface tension of the liquid 112 in the mesh 110). In electrical applications, such jetting of the liquid 112 could cause damage or injury to the components of the system, in turn possibly injuring operators or other persons situated nearby.

The mesh 110 has a mechanical compliance, e.g., spring force, that provides multiple contact points 114 between the thermal interface 100 and the heat source 102 and heat sink 104. The multiple contact points 114 promote intimate contact between the liquid 112 and both the heat source 102 and the heat sink 104, thereby enhancing efficient heat transfer therebetween. The multiple contact points 114 also minimize the occurrence of any voids that may form where the liquid 112 is not in direct contact with a portion of the surface of either the heat source 102 or heat sink 104. Moreover, the size of any voids that do form, e.g., void 116, will be minimized due to the capillary action attracting the liquid 112 to the interfaces between the elements of the mesh 110 and the interfaces between the multiple contact points 114 and the surface of the heat source 102 or heat sink 104. In embodiments where the mesh 110 is thermally conductive, the multiple contact points 114 further provide continuous thermally conductive paths between the heat source 102 and the heat sink 104 through the mesh 110 itself.

As used herein, the term "mesh" refers to the structural arrangement of the material and includes woven and non-woven webs or screens, porous or sponge-like solids, a matrix of wires, filaments, strands, fibers, or particles, or any other material form that provides a mechanically compliant structure and has sufficient porosity for the liquid 112 to form a thermally conductive path between the heat source 102 and the heat sink 104. In one embodiment, the mesh 110 comprises about 15% of the total volume of the thermal interface 100. It should be noted, however, that this value is application dependent and depends upon the wetting ability of the material comprising the mesh 110 and the mechanical stiffness of the mesh 110. The mesh 110 generally is mechanically compliant and includes many pores through which the liquid 112 can propagate and coat.

The mesh 110 may have a thermal conductivity greater than, equal to, or less than the thermal conductivity of the liquid 112. The mesh 110 may be made of metal or organic materials compatible with the conductive liquid 112, e.g., the mesh 110 may be inert with respect to the liquid 112 or reactive with the liquid 112 in a manner that does not substantially degrade the structural or thermal properties of the thermal interface 100 or otherwise harm the heat source 102 or the heat sink 104. Alternatively, the mesh 110 may comprise a material incompatible with the liquid 112, in which case the mesh 110 may further comprise a coating that is compatible with the liquid 112, as further described below.

In one embodiment, the mesh 110 comprises at least one of: copper, chromium, iron, nickel, tantalum, titanium, and tungsten wire. Alternatively or in combination, the mesh 110 may comprise at least one of: copper, chromium, iron, molybdenum, nickel, tantalum, titanium, tungsten, glass, and silicon carbide particles. Alternatively or in combination, the mesh 110 may comprise at least one of: fiberglass, glass wool, copper wool, porous graphite, machined graphite, electroformed nickel, carbon nanotubes, sintered metal particles, and the like. In one embodiment, the mesh 110 comprises a metal wire mesh. In one embodiment, the mesh 110 comprises a copper mesh or a tungsten mesh. In another embodiment, the mesh 110 may comprise glass wool or a glass mesh. It is contemplated that the above materials may be used in combination. For example, in one embodiment, the mesh 110 comprises a tungsten wire mesh and tungsten particles.

The size of the elements of the mesh 110 depend upon the size of the thermal interface 100, which in turn depends upon the gap size between the heat source 102 and the heat sink 104. Typical gap sizes range from about 50 to about 100 microns for IC chip applications. For such applications, typical wire diameters may range from about 25 to about 100 microns in diameter and typical particle sizes may range from about 2 microns to about 75 microns. It is contemplated that other diameters and particle sizes may be utilized as necessary for a particular application.

The mesh 110 may further comprise an optional coating. The optional coating may protect the mesh 110 from any incompatibility with the chemistry of the liquid 112 or may improve the wettability of the mesh 110 with respect to the liquid 112. For example, in one embodiment, the mesh 110 may comprise chromium-coated copper to remain compatible with a heat transfer liquid 112 comprising a gallium indium tin alloy. In another embodiment, the mesh 110 may comprise fiberglass having a coating of a wetting agent to improve the wettability of the mesh 110 with respect to the liquid 112. It is contemplated that the coating may be formed over a mesh 110 that is compatible with the liquid 112. It is further contemplated that the coating may comprise multiple layers comprising the same or different materials.

Optionally, a similar coating (not shown) may for formed on one or more of the heat source 102 and heat sink 104 where desired to improve compatibility between the materials comprising the heat source 102 and/or heat sink 104 and the liquid 112. The coating may also be selected to enhance the adhesion of subsequent layers, to act as an oxidation prevention layer, or to improve the wettability of the liquid 112 with respect to the surface of the heat source 102 and/or heat sink 104. It is contemplated that multiple coatings may be provided, for example, a first coating that is compatible with the liquid 112, and a second coating that enhances wettability of the liquid 112.

The coatings may be applied by conventional means, such as by evaporation, sputtering, plating, chemical vapor deposition, and the like. The thickness of the coating or coatings will depend upon the material comprising the coating, the method of application, and the coverage required to achieve the intended purpose of the coating. For example, in one embodiment, an about 2,500 angstrom chromium coating may be disposed on the heat sink 104. The chromium coating may further have an about 300 angstroms thick layer of either gold or platinum deposited thereon as an oxidation prevention layer.

The thermally conductive liquid 112 fills the spaces, pores, or voids between the elements of the mesh 110. In one embodiment, the liquid 112 is a liquid metal. The liquid metal has a high surface tension and strongly adheres to the large surface area of the mesh, thus advantageously containing the liquid metal, which is corrosive and electrically conductive and poses containment concerns when used in electronic applications.

Furthermore, the strong adhesion of the liquid 112 to the mesh 110 facilitates ease of handling of the thermal interface 100. For example, the mesh 110 may be pre-cut and the liquid 112 pre-measured and combined with the mesh 110 to pre-form a thermal interface 100 suitable for a particular application. With a known interface size of a given heat source (for example, an IC chip) and heat sink, a pre-formed thermal interface 100 may be constructed that may be easily and rapidly applied between the heat source 102 and the heat sink 104. Moreover, in embodiments where practical, the thermal interface 100 may additionally be frozen to solidify the liquid 112 disposed in the mesh 110 for further ease in handling and fabrication.

Such a pre-formed thermal interface 100 may be conveniently packaged to protect the thermal interface 100 and provide ease of handling of an individual thermal interface or multiple thermal interfaces. The pre-formed thermal interface 100, whether packaged or not, may be easily and rapidly applied between the heat source 102 and the heat sink 104 during a manual or automated assembly process. In one embodiment, the pre-formed thermal interface 100 is vacuum packaged in polyethylene plastic to protect it from oxidation.

In one embodiment, the liquid metal comprises at least one of gallium, mercury, gallium-indium and mercury-gold. In one embodiment, the liquid 112 comprises a gallium indium tin alloy. In one embodiment, the liquid 112 comprises a gallium indium tin eutectic and the mesh 110 comprises 0.2 micron tungsten particles mixed into the liquid 112 at approximately 15-25 percent by weight, thus forming a convenient paste-like thermal interface material. Optionally, the mesh 110 may further comprise a woven tungsten mesh formed of about 1-2 mil tungsten wire in the shape of a square perform. The combination of the liquid 112 and the mesh 110 may have a thermal resistance in the range of about 2 to 3 mm$^2$° C./W or less.

A gasket 106 may optionally be disposed about the perimeter of the thermal interface 100. The gasket 106 generally seals the interior space between the heat source 102 and the heat sink 104 where the thermal interface 100 is disposed. The gasket 106 assists in reducing the potential for leakage of the liquid 112 from the thermal interface 100. For example, in embodiments where the surface tension between the liquid 112 and the mesh 110 is relatively low, the gasket 106 helps to contain the liquid 112 within the thermal interface 100. The gasket 106 may also prevent oxidation or other deterioration of the liquid 112 from exposure to air, moisture, or other contaminants. For example, in embodiments where the liquid 112 is a gallium indium tin alloy, exposed regions of the liquid 112 may oxidize. However, this oxidation is self-limiting as the oxidation layer forms a barrier that ultimately protects the remainder of the liquid 112 from further oxidation. The gasket 106 may comprise a soft material, such as nylon, polytetrafluoroethylene (PTFE), silicone, rubber, or VITON®. Those skilled in the art will appreciate the gasket 106 may take any materials-compatible form that allows the gasket 106 to seal the liquid 112 between the heat source 102 and the heat sink 104.

Figure 2:
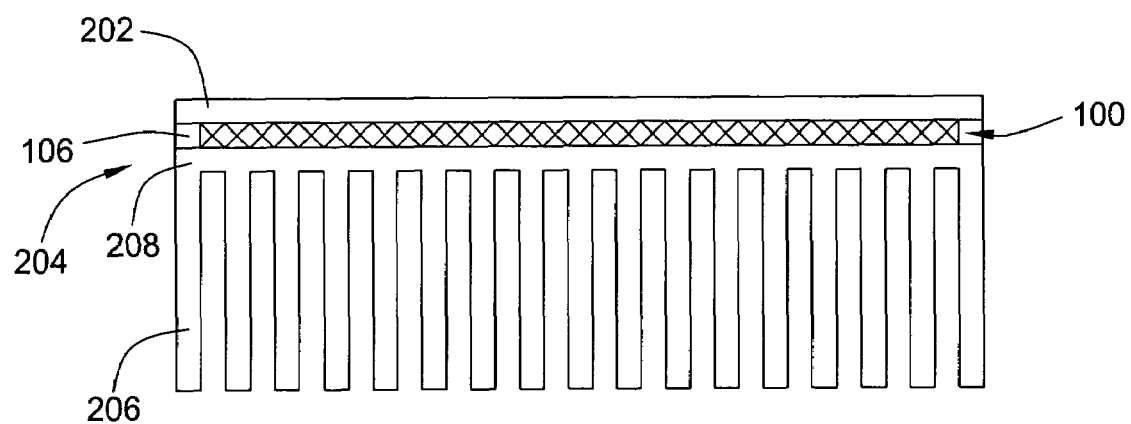
FIG. 2 illustrates a cross sectional view of one embodiment of a thermal transfer system utilizing one embodiment of the thermal interface of the present invention.

FIG. 2 depicts a side view of one embodiment of a thermal transfer system utilizing the thermal interface 100. In the embodiment depicted in FIG. 2, an IC chip 202 is coupled to a heat sink 204 via the thermal interface 100. A gasket 106 is disposed about the perimeter of the thermal interface 100 and forms a seal between the chip 202 and the heat sink 204. For clarity, clamps or fixtures utilized to secure the chip 202 to the heat sink 204 are not shown in FIG. 2. The heat sink 204 comprises a cold plate 208 having a plurality of fins 206 extending therefrom, such that the air flow over the increased surface area increases the rate of thermal transfer from the heat sink 204 to the surrounding air.

Thus, the present invention represents a significant advancement in thermal interfaces between a heat source and a heat sink, and particularly in the field of integrated circuit chip cooling. A thermal interface is disclosed that facilitates reliable and improved heat transfer between a chip and a heat sink, allowing the IC device to operate more reliably and efficiently than is enabled by conventional heat transfer methods. Furthermore, the thermal interface may be pre-formed for ease of fabrication.

While foregoing is directed to the preferred embodiment of the present invention, other and further embodiments of the invention may be devised without departing from the basic scope thereof, and the scope thereof is determined by the claims that follow.

The invention claimed is:

1. A thermal interface for assisting in the transfer of heat from a heat source to a heat sink, the thermal interface comprising:
   a mesh; and
   a liquid disposed in the mesh, wherein the mesh and the liquid are adapted for contacting both the heat source and the heat sink when disposed therebetween, wherein the liquid comprises liquid metal.

2. The thermal interface of claim 1, wherein the liquid comprises at least one of: gallium, mercury, gallium-indium or mercury-gold.

3. The thermal interface of claim 1, wherein the liquid comprises a gallium indium tin alloy.

4. The thermal interface of claim 1, wherein the mesh comprises at least one of: a woven web, a non-woven web, a screen, a porous or sponge-like solid, or a matrix of wires, filaments, strands, fibers, or particles.

5. The thermal interface of claim 1, wherein the mesh comprises at least one of: copper, chromium, iron, molybdenum, nickel, tantalum, titanium, or tungsten.

6. The thermal interface of claim 5, wherein the mesh comprises wire and particles.

7. The thermal interface of claim 1, wherein the mesh comprises at least one of: copper wire or copper particles.

8. The thermal interface of claim 7, wherein the copper is coated with chromium.

9. The thermal interface of claim 1, wherein the mesh comprises at least one of: fiberglass or glass particles.

10. The thermal interface of claim 1, wherein the mesh comprises at least one of: tungsten wire or tungsten particles.

11. The thermal interface of claim 1, wherein the mesh comprises at least one of: copper wool, porous graphite, machined graphite, carbon nanotubes, or electroformed nickel.

12. The thermal interface of claim 1, further comprising:
   a coating formed over the mesh.

13. The thermal interface of claim 12, wherein the coating comprises chromium.

14. The thermal interface of claim 12, wherein the coating comprises a material compatible with the liquid.

15. The thermal interface of claim 1, further comprising:
   a gasket disposed about a perimeter of the mesh and adapted for contacting the heat sink and the heat source when the thermal interface is disposed therebetween, thereby forming a seal.

16. The thermal interface of claim 1, wherein the mesh comprises tungsten wire and tungsten particles, and wherein the liquid comprise a gallium indium tin alloy.

17. A heat transfer assembly comprising:
   a heat source;
   a heat sink; and
   a thermal interface disposed between the heat source and the heat sink, the thermal interface comprising:
      a mesh; and
      a liquid disposed in the mesh, wherein the mesh and the liquid are in contact with both the heat source and the heat sink, wherein the liquid comprises a liquid metal.

18. The assembly of claim 17, wherein the liquid comprises at least one of: gallium, mercury, gallium-indium or mercury-gold.

19. The assembly of claim 17, wherein the liquid comprises a gallium indium tin alloy.

20. The assembly of claim 17, wherein the mesh comprises at least one of: a woven web, a non-woven web, a screen, a porous or sponge-like solid, or a matrix of filaments, strands, fibers, or particles.

21. The assembly of claim 17, wherein the mesh comprises at least one of: copper, chromium, iron, molybdenum, nickel, tantalum, titanium, or tungsten.

22. The assembly of claim 21, wherein the mesh comprises at least one of: wire or particles.

23. The assembly of claim 17, wherein the mesh comprises at least one of: copper wire or copper particles.

24. The assembly of claim 23, wherein the copper is coated with chromium.

25. The assembly of claim 17, wherein the mesh comprises at least one of: fiberglass or glass particles.

26. The assembly of claim 17, wherein the mesh comprises at least one of: tungsten wire or tungsten particles.

27. The assembly of claim 17, wherein the mesh comprises at least one of: copper wool, porous graphite, machined graphite, carbon nanotubes, or electroformed nickel.

28. The assembly of claim 17, further comprising:
a coating formed over the mesh.

29. The assembly of claim 28, wherein the coating comprises chromium.

30. The assembly of claim 28, wherein the coating comprises a material compatible with the liquid.

31. The assembly of claim 17, further comprising:
a gasket disposed about the perimeter of the mesh and contacting the heat sink and the heat source, thereby forming a seal.

32. The assembly of claim 17, wherein the heat source is an integrated circuit chip.

33. The assembly of claim 17, wherein the heat sink comprises at least one of: air-cooled fins, water-cooled fins, heat pipes, a radiator, or a thermal spreader.

34. The assembly of claim 17, wherein the heat source is an integrated circuit chip, the liquid comprises a gallium indium tin alloy, and wherein the mesh comprises tungsten wire and tungsten particles.

35. A method of cooling a heat source with a heat sink, comprising:
providing a thermal interface having a mesh and a liquid disposed in the mesh, wherein the liquid comprises a liquid metal; and
interposing the thermal interface between the heat source and the heat sink, such that the mesh and the liquid are in contact with the heat source on a first side of the thermal interface and in contact with the heat sink on a second side of the thermal interface.

36. The method of claim 35, where in the mesh comprises at least one of: copper, chromium, iron, nickel, tantalum, titanium, or tungsten.

37. The method of claim 35, wherein the liquid metal comprises at least one of: gallium, mercury, gallium-indium or mercury-gold.

* * * * *